US008306049B2

(12) United States Patent
Takahashi (10) Patent No.: US 8,306,049 B2
(45) Date of Patent: Nov. 6, 2012

(54) MULTICAST SUBSCRIPTION BASED ON FORWARD ERROR CORRECTION

(75) Inventor: Eduardo S. C. Takahashi, Cupertino, CA (US)

(73) Assignee: Microsoft Corporation, Redmond, WA (US)

( * ) Notice: Subject to any disclaimer, the term of this patent is extended or adjusted under 35 U.S.C. 154(b) by 375 days.

(21) Appl. No.: 12/709,776

(22) Filed: Feb. 22, 2010

(65) Prior Publication Data

US 2011/0209025 A1    Aug. 25, 2011

(51) Int. Cl.
*H04J 3/26* (2006.01)
(52) U.S. Cl. ........ 370/432; 714/746; 714/768; 714/751; 714/784; 370/390; 370/391
(58) Field of Classification Search .................. None
See application file for complete search history.

(56) References Cited

U.S. PATENT DOCUMENTS

| | | | | |
|---|---|---|---|---|
| 6,278,716 | B1 * | 8/2001 | Rubenstein et al. | 370/432 |
| 6,996,097 | B1 * | 2/2006 | Chou et al. | 370/389 |
| 7,224,702 | B2 | 5/2007 | Lee | |
| 7,366,172 | B2 * | 4/2008 | Chou et al. | 370/389 |
| 7,447,148 | B2 | 11/2008 | Gao et al. | |
| 2005/0207415 | A1 * | 9/2005 | Curcio et al. | 370/390 |
| 2005/0249211 | A1 * | 11/2005 | Chou et al. | 370/389 |
| 2008/0137656 | A1 * | 6/2008 | Shin | 370/390 |
| 2010/0260180 | A1 * | 10/2010 | Wu et al. | 370/390 |

FOREIGN PATENT DOCUMENTS

| | | |
|---|---|---|
| WO | 2008006011 A2 | 1/2008 |
| WO | 2009054822 A1 | 4/2009 |
| WO | 2009134220 A1 | 11/2009 |

OTHER PUBLICATIONS

"Smooth Streaming", Retrieved at www.iis.net/extensions/SmoothStreaming>>, Dec. 24, 2009, pp. 3.*
Tan, et al., "Video Multicast Using Layered FEC and Scalable Compression", Retrieved at /ieeexplore.ieee.org/stamp/stamp.jsp?arnumber=00911162>>, IEEE Transactions on Circuits and Systems for Video Technology, Vo. 11, No. 3, Mar. 2001, pp. 327-386.*
Chilamkurti, et al., "Video Multicasting Using Layered FEC on Split Protocol", Retrieved at /ieeexplore.ieee.org/stamp/stamp.jsp?arnumber=01414496>>, TENCON 2004 Region 10 Conference, vol. 1, Nov. 21-24, 2004, pp. 618-621.*
"International Search Report", Mailed Date: Oct. 6, 2011, Application No. PCT/US2011/025349, Filed Date: Feb. 17, 2011, pp. 8.

(Continued)

*Primary Examiner* — John Trimmings
(74) *Attorney, Agent, or Firm* — Alleman Hall McCoy Russell & Tuttle LLP (57) ABSTRACT

Embodiments are disclosed herein that relate to multicast subscription based on forward error correction. One disclosed embodiment comprises a network-accessible server having a data-holding subsystem holding instructions executable by a logic subsystem to receive a content item, and form a first version of the content item having a first level of forward error correction and a second version of the content item having a second level of forward error correction. The instructions are further executable to stream the first version of the content item to a first multicast address, and while streaming the first version of the content item, stream the second version of the content item to a second multicast address.

18 Claims, 5 Drawing Sheets

OTHER PUBLICATIONS

Chilamkurti, et al., "Video Multicasting Using Layered FEC on Split Protocol", Retrieved at <<http://ieeexplore.ieee.org/stamp/stamp.jsp?arnumber=01414496>>, TENCON 2004 Region 10 Conference, vol. 1, Nov. 21-24, 2004, pp. 618-621.

Tan, et al., "Video Multicast Using Layered FEC and Scalable Compression", Retrieved at <<http://ieeexplore.ieee.org/stamp/stamp.jsp?arnumber=00911162>>, IEEE Transactions on Circuits and Systems for Video Technology, vol. 11, No. 3, Mar. 2001, pp. 327-386.

Hsiao, et al., "Adaptive FEC Scheme for Layered Multimedia Streaming over Wired/Wireless Channels", Retrieved at <<http://ieeexplore.ieee.org/stamp/stamp.jsp?arnumber=04014086>>, Browse > Conferences> Multimedia Signal Processing, 2005 IEEE 7th Workshop on, Oct. 30-Nov. 5, 2005, pp. 4.

Nafaa, et al., "On Interaction between Loss Characterization and Forward Error Correction in Wireless Multimedia Communication", Retrieved at <<http://ieeexplore.ieee.org/stamp/stamp.jsp?tp=&arnumber=1494573>>, May 2005, pp. 1390-1394.

Razavi, et al., "Adaptive Packet-Level Interleaved FEC for Wireless Priority-Encoded Video Streaming—Published Date: 2009", Retrieved at <<http://downloads.hindawi.com/journals/am/2009/982867.pdf>>, Advances in Multimedia, vol. 2009, Jan. 2009, pp. 1-14.

Wu, et al., "Adjusting Forward Error Correction with Quality Scaling for Streaming MPEG", Retrieved at <<http://web.cs.wpi.edu/~claypool/papers/adaptive-fec-qual/paper.pdf>>, Proceedings of the international workshop on Network and operating systems support for digital audio and video, Jun. 13-14, 2005, pp. 6.

"Smooth Streaming", Retrieved at <<http://www.iis.net/extensions/SmoothStreaming>>, Dec. 24, 2009, pp. 3.

* cited by examiner

MULTICAST SUBSCRIPTION BASED ON FORWARD ERROR CORRECTION

BACKGROUND

Streaming of media content over a network may utilize large amounts of resources, both at the content source and in the network. Therefore, point-to-point distribution (i.e., unicasting) tends to not scale well with the size of the target population of consumers. Point-to-multipoint distribution (i.e., multicasting) may be more practical in many cases, as in multicast distribution a single source sends the content to multiple consumers, which allows resource sharing/savings at the source server and all through the network. Multicasting may be used for streaming any suitable type of media content, such as video-on-demand, television, etc.

However, difficulties may be encountered in ensuring a level of communication reliability when distributing media content via multicasting, as a number of end-points involved in coordinating the communication process is larger than for unicast scenarios. One approach for increasing reliability involves utilizing feedback from a consumer to trigger recovery of data. However, such methods may be difficult to implement efficiently due to the amount of computing and communication resources utilized by such feedback mechanisms.

SUMMARY

Various embodiments that relate to multicast subscription selection based on forward error correction are disclosed herein. For example, one disclosed embodiment provides a network-accessible server having a data-holding subsystem holding instructions executable by a logic subsystem to receive a content item, to form a first version of the content item having a first level of forward error correction and to form a second version of the content item having a second level of forward error correction. The instructions are further executable to stream the first version of the content item to a first multicast address, and while streaming the first version of the content item, to stream the second version of the content item to a second multicast address.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Communications reliability in multicast transmissions also may be addressed by introducing redundancy into the data stream that allows a consumer to reconstruct the data. Such methods are known as forward error correction. The redundant data in the data stream allows a consumer, such as a client computing device to correct errors at the client using the redundant data. The client computing device therefore may correct errors without requesting the sender (e.g., a server) resend data and/or send additional data.

Forward error correction may be intrinsically simpler and may provide faster recovery than methods involving client feedback when the amount and pattern of data losses are within target design limits. For example, some live media content streaming may utilize client detection of data losses and negative acknowledgements (NAKs) to the server for error recovery via data retransmission. In such scenarios, if the number of NAKs falls below a threshold, the retransmission may use point-to-point (unicast) delivery and if the number of NAKs goes above the threshold, retransmission may be multicast to all clients. However, as mentioned above, feedback-based recovery for reliable multicast may not scale well with the number of clients when the data losses in the network become significant. For example, multicast retransmissions may propagate to all clients regardless of whether a particular client has experienced communication errors, thereby increasing bandwidth usage. Also, support for such retransmission may involve a certain amount of data persistence in the servers and more complex state machines, resulting in an overall more complex solution.

However, forward error correction also may impose significant overhead on communications that may benefit some consumers more than others. The redundant data inserted into the data stream propagates to all clients in the multicast session regardless of whether they need that redundant data or not. The nature and intensity of communication impairments might change with network location and time.

Therefore, various embodiments are disclosed herein that relate to multicasting multiple streams of a media content item, wherein each multicast stream is encoded with different levels of forward error correction. As such, a client computing device may, upon detecting data losses, react by switching dynamically to a multicast stream with a different level of forward error correction, as described in more detail below.

Figure 1:
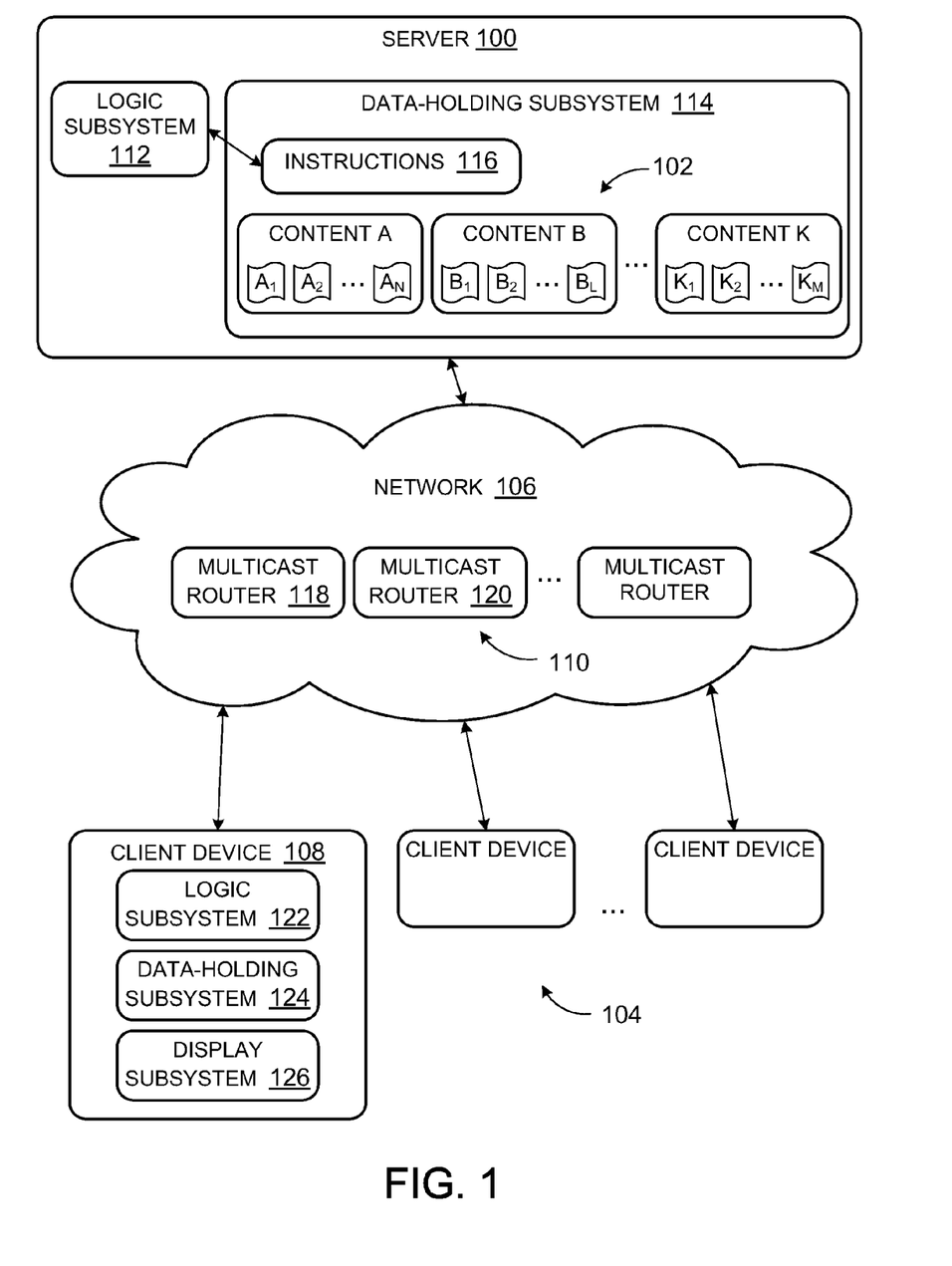
FIG. 1 schematically shows an embodiment of a network environment comprising a network-accessible server configured to multicast media content to a plurality of client computing devices in accordance with an embodiment of the present disclosure.

FIG. 1 shows a server 100 configured to multicast content 102, such as multimedia programming, to a plurality of client computing devices 104 configured to connect to the server 100 via a network 106. As an example, network 106 can be an Internet Protocol (IP) network, and server 100 can be configured to stream Internet Protocol television (IPTV). Nonlimiting examples of IPTV include on-demand content and live television. Server 100 can be configured to multicast content 102 by simultaneously streaming multiple streams of the content to which client computing devices 104 can subscribe. Such multiple streams of content are illustrated in FIG. 1 as an arbitrary number N of streams for an arbitrary number K of content items. Client computing devices 104 may include computers, gaming consoles, mobile devices, high-definition televisions, set-top boxes, and/or any other suitable type of client device.

Server 100 may be configured to stream each content item stream to a multicast address on network 106, and one of more of client computing devices 104, such as example client computing device 108, can receive a desired stream by subscribing to the corresponding address. Further, one or more multicast-enabled routers 110 (i.e., multicast routers) may be used to replicate and deliver the content. For example, server 100 can send packets of content to multicast routers 110, and the content is then replicated in the network by multicast routers 110 as needed, allowing efficient delivery to client computing devices 104. Such routers can represent nodes in a multicast distribution tree, which can self-adjust and scale, as discussed in more detail with reference to FIG. 4. The server may be further configured to transmit a client manifest file identifying the multicast streams available for subscription and the properties (e.g., level of forward error correction, bitrate, etc.) of each stream, as described in more detail with reference to FIGS. 2 and 5.

Server 100 further comprises a logic subsystem 112 and a data-holding subsystem 114. Server 100 may further include other components not shown in FIG. 1. It will be understood that the term "server" may be used to describe a single server, multiple servers, etc. Logic subsystem 112 may include one or more physical devices configured to execute one or more instructions, such as instructions 116. For example, logic subsystem 112 may be configured to execute one or more instructions that are part of one or more programs, routines, objects, components, data structures, or other logical constructs. Such instructions may be implemented to perform a task, implement a data type, transform the state of one or more devices, or otherwise arrive at a desired result. The logic subsystem may include one or more processors that are configured to execute software instructions. Additionally or alternatively, the logic subsystem may include one or more hardware or firmware logic machines configured to execute hardware or firmware instructions. The logic subsystem may optionally include individual components that are distributed throughout two or more devices, which may be remotely located in some embodiments.

Data-holding subsystem 114 may include one or more physical devices configured to hold data, such as content 102, and/or instructions, such as instructions 116, executable by the logic subsystem to implement the herein described methods and processes. When such methods and processes are implemented, the state of data-holding subsystem 114 may be transformed (e.g., to hold different data). Data-holding subsystem 114 may include removable media and/or built-in devices. Data-holding subsystem 114 may include optical memory devices, semiconductor memory devices, and/or magnetic memory devices, among others. Data-holding subsystem 114 may include devices with one or more of the following characteristics: volatile, nonvolatile, dynamic, static, read/write, read-only, random access, sequential access, location addressable, file addressable, and content addressable. In some embodiments, logic subsystem 112 and data-holding subsystem 114 may be integrated into one or more common devices, such as an application specific integrated circuit or a system on a chip.

Data-holding subsystem 114 may comprise instructions executable by logic subsystem 112 to stream multimedia programming as described above, as well as instructions executable to form the various streams with different levels of forward error correction from a content item received from a content producer or other content source. Further, in some cases the data-holding subsystem may be in the form of computer-readable removable media, which may be used to store and/or transfer data and/or instructions executable to implement the herein described methods and processes.

Figure 2:
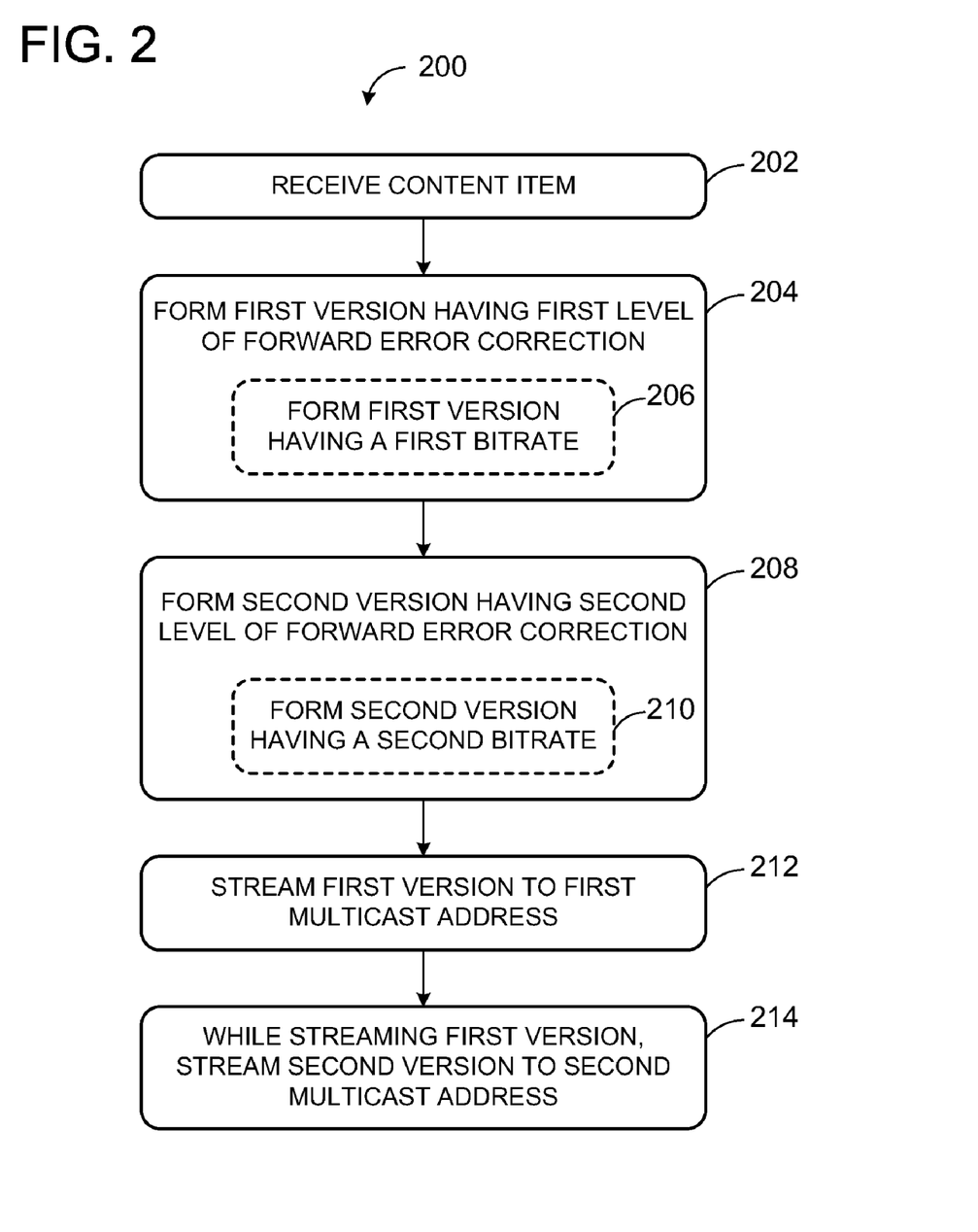
FIG. 2 shows a flow diagram of an example method of live multicasting in accordance with an embodiment of the present disclosure.

FIG. 2 shows an example embodiment of a method 200 for streaming content in accordance with the present disclosure. At 202, method 200 includes receiving a content item, such as a media content item. As described above, in some embodiments, such a content item may be multimedia programming such as a live television multimedia item received from a source such as a live audio-visual source such as a broadcast television source, movie production source, etc. In other embodiments, any other suitable content item may be received from any other suitable source. The content item may be any amount of data, and it may be a fragment of a larger entity, or a stream of data. For example a server may receive and process small blocks of data as they arrive from a source.

Next, at 204, method 200 includes forming a first version of the content item having a first level of forward error correction. For example, a server may form a file for streaming, and encode within the file a desired level of forward error correction by producing redundant data and embedding redundant data into the stream. As adding redundant data to the file increases a size of the stream, a quality level of the file may be balanced with the amount of redundant data added so that the stream bitrate has a desired first bitrate, as illustrated at 206.

As a specific example of balancing a quality level and forward error correction level of a file for streaming, a 10 Mbps stream encoded with a first, higher level of forward error correction has greater error resilience but lesser quality level than a 10 Mbps stream having no forward error correction. Likewise, a 10 Mbps stream encoded with a second, lower level of forward error correction has less error resilience and higher quality than the stream encoded with the first, higher level of error correction, as a lesser amount of redundant data is added into the stream, but better error resilience and lower quality than the 10 Mbps stream encoded with no forward error correction.

At 208, method 200 includes forming a second version of the content item having a second level of forward error correction. In the context of multicasting, the first version and the second version of the content item may be two streams of a plurality of streams created by the server from a single content item. For example, the content item may be a live television sporting event, and the server may create ten different streams of the content, each stream having a different level of forward error correction. As mentioned above, this is shown in FIG. 1 as an arbitrary number N of streams for each of an arbitrary number K of content items.

In some embodiments, the second version may have a bitrate 210 that is equivalent to the bitrate of the first version of the content item to allow for the multicasting of a plurality of streams each having a same bitrate but a different level of forward error correction. In other embodiments, the first version and the second version of the content item may have different levels of forward error correction and different bitrates. As one example of such an embodiment, a server may form a plurality of versions of the content item at each of a plurality of bitrates, wherein each version of the content item at a selected bitrate has a different level of forward error correction than other versions of the same bitrate.

In some embodiments, forming the first and second versions of the content item may also include transcoding the content item to a different format. For example, the first version of the content item may be formed by transcoding the content item and embedding the first level of forward error correction into the content item, and similarly, the second version of the content item may be formed by transcoding the content item and embedding the second level of forward error correction into the content item. In the example of a live television sporting event introduced above, the live television may be received from a broadcasting network and transcoded into a different format that is suitable for an IPTV environment.

Figure 3:
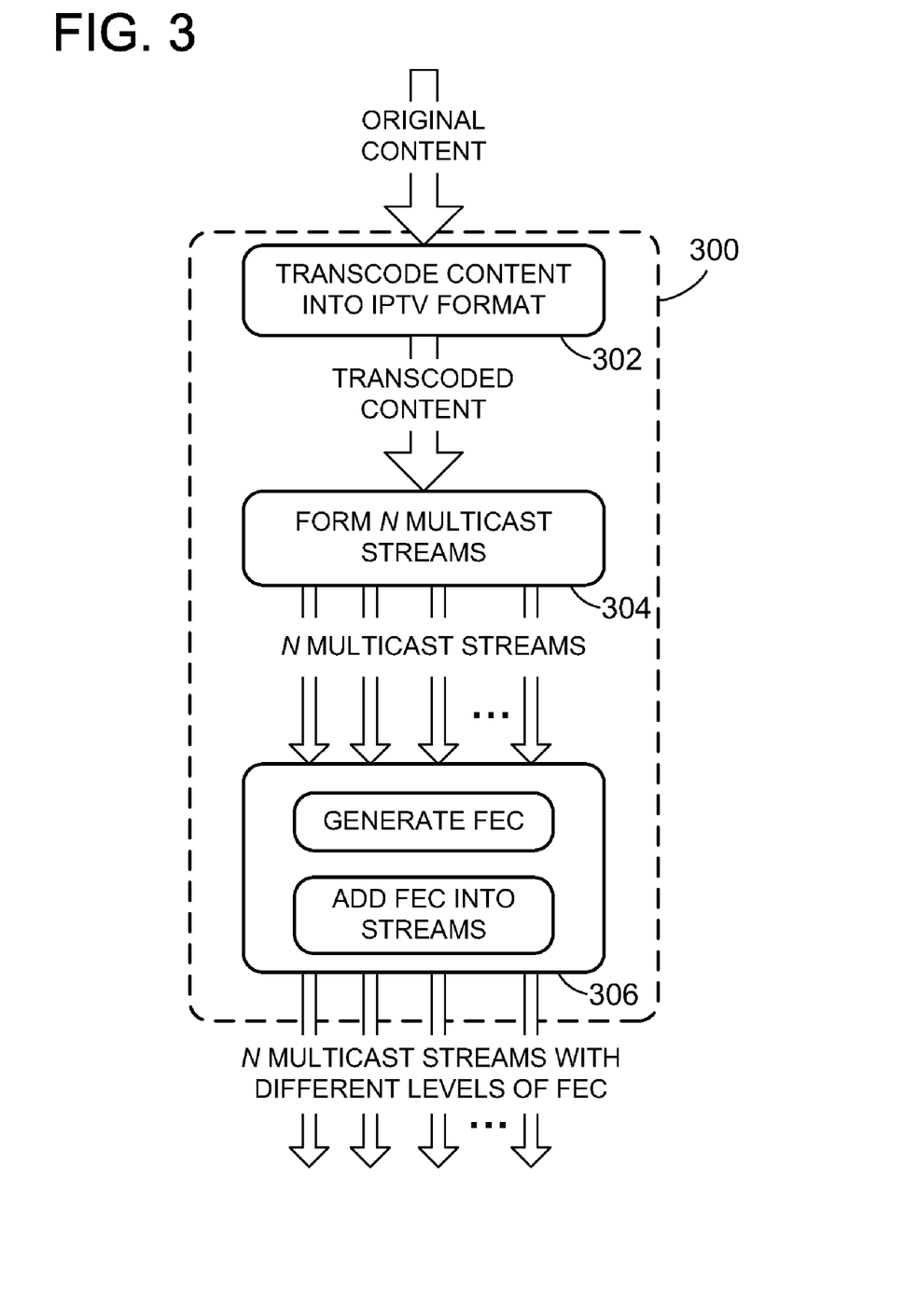
FIG. 3 shows an example data flow diagram illustrating a formation of a plurality of streams of multimedia content in accordance with an embodiment of the present disclosure.

FIG. 3 shows a diagram 300 illustrating embodiment of an approach for generating a plurality of content streams with different levels of forward error correction from a received content item. First, the original content item is received, and then may be optionally transcoded into a format different than that of the original content, as indicated at 302. Next, N multicast streams can be created from the received content item, as indicated at 304. It will be understood that, in other embodiments, the original content may not be transcoded into another format, and the N multicast streams formed at 304 may have the same format as the original content item. It will further be understood that forming the N multicast streams at 304 may include forming each stream to have a same bitrate, or forming the streams to have different bitrates.

Next, as shown at 306, N different levels of forward error correction may be generated, and a level of forward error correction may be added to each stream, thus yielding N multicast streams each having a different level of forward error correction. In some embodiments, the N multicast streams having different levels of forward error correction may have a same bitrate or may have different bitrates. In the case of the former, a quality level of each stream may be adjusted so as to offset the amount of forward error correction data to be added into the stream, and so that the stream can maintain a desired bitrate. Alternatively, the media quality of each stream may be not be changed, or may be degraded at a level that does not fully offset the amount of redundant data being added, such that adding forward error correction changes the bitrate of the stream.

It can be appreciated that, although forming the streams at 304 and introducing the forward error correction data at 306 are depicted in FIG. 3 as being distinct from one another, the forward error correction data may be generated and added to the streams in a single process.

Returning to FIG. 2, upon forming the multicast streams, at 212 method 200 includes streaming the first version of the content item to a first multicast address. Likewise, at 214, method includes streaming the second version of the content item to a second multicast address while streaming the first version of the content item. For example, as illustrated in FIG. 1, one version of Content A, namely $A_1$, can be streamed to a multicast stream going through multicast router 118 and another version of Content A such as $A_N$ may be streamed to a multicast stream going through another router such as multicast router 120. As a specific use example, the server may stream the first version of the content item and stream the second version of the content item as live television via Internet Protocol television (IPTV) multicasting.

By streaming each version of the content item to a multicast address, each multicast router can then replicate the stream as needed to provide efficient delivery to a client. As introduced above, the multicast routers can represent nodes in a multicast distribution tree, which can self-adjust and scale. The multicast distribution tree can control the path that the multicast traffic takes through the network to deliver traffic to all clients. As such, the multicast distribution tree can self-adjust to provide clients with data as issues arise.

Figure 4:
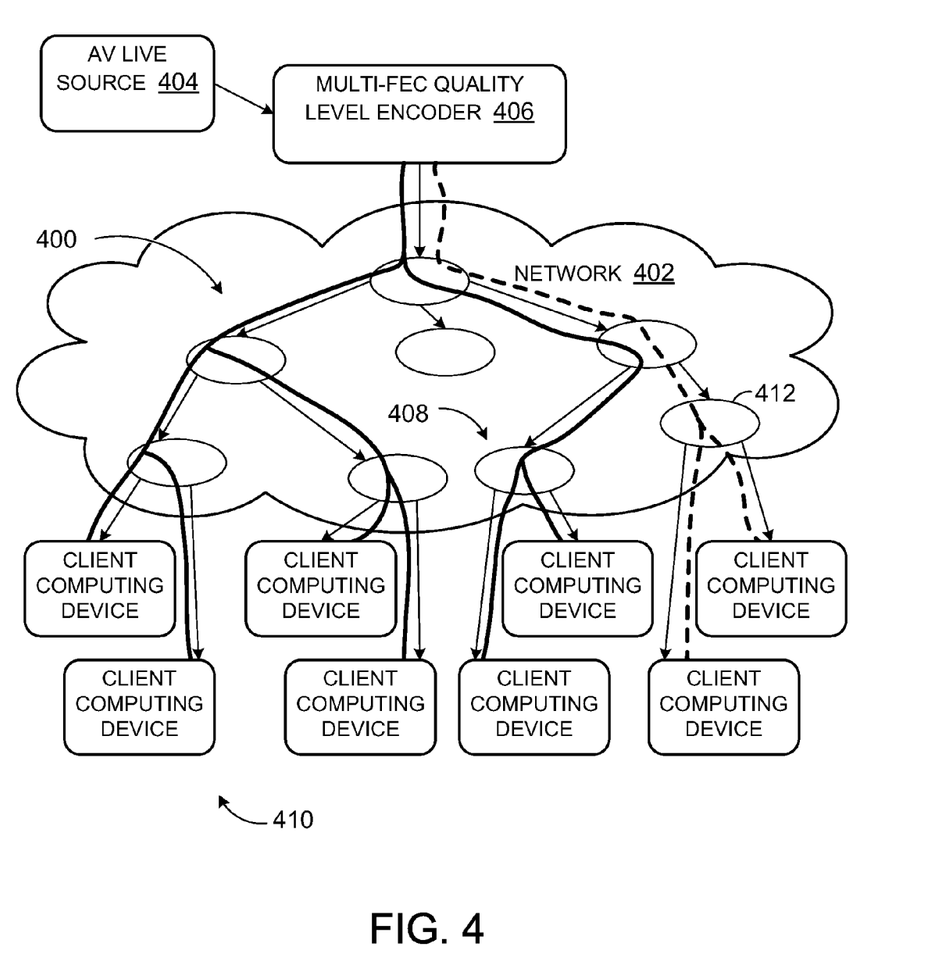
FIG. 4 schematically shows an example of a multicast distribution tree in accordance with an embodiment of the present disclosure.

FIG. 4 illustrates an example multicast distribution tree 400 within network 402. The content may originate at a multimedia source (e.g. live video and audio source) such as audio-visual source 404 which feeds a server that is configured to convert the stream into a streaming format, and to generate versions of a content item with multiple levels of forward error correction as described herein. As an example, such a server may utilize a multi-level forward error correction (FEC) quality level encoder 406 to generate the content with multiple levels of forward error correction. The streaming format may allow a client to switch between the content streams and present a consistent virtual recreation of the original content, yet the actual data received may originate from distinct streams.

As mentioned above, in some embodiments, each stream of a content item with a different level of forward error correction may be encoded at the same bitrate. Likewise, multiple bitrates and multiple levels of forward error correction may both be generated for a single content item. In a multicast distribution scenario, the server may then stream all the alternative quality levels all the time using different multicast addresses as destinations. For example, the multicast addresses may direct streams to routers serving as nodes 408 within the multicast distribution tree 400. These routers can provide content to client computing devices 410. For example, client computing devices 410 therefore may subscribe to a stream with a desired quality level and level of forward error correction.

Since network data losses may occur when a network element (e.g. switches, routers, wireless links) drops a packet, the state of those elements can affect all multicast clients located downstream from that element. If all clients implement the same behavior regarding error correction, a given loss characteristic can trigger downstream clients to switch quality levels. As such, the multicast distribution tree will self-adjust so that branches with higher data loss (e.g., example high loss network node 412) will receive streams with higher error resilience, while branches with lower data loss will receive streams with less error resilience and higher quality.

Returning to FIG. 2, multicast streaming based on forward error correction as illustrated by method 200 may provide a simple and efficient way to achieve multiple levels of reliable media streaming in a multicast environment with limited resources, wherein the multiple levels of reliability are implemented through encoding the stream with different levels of forward error correction. The media quality level may be balanced with the amount of redundant data required for the forward error correction so that the stream bitrate stays within a target limit if desired. Further, in some embodiments, the multiple streams can be tied together by the use of streaming techniques that allow a client to switch between streams dynamically as it sees fit. For example, such a streaming approach may allow for the definition of synchronization points among media streams for clean\uninterrupted switching between streams, transparent to the media presentation.

In order to enable a client to determine what multicast streams are available from a server, method 200 may further include transmitting to the client a client manifest file that identifies the multicast streams that are available for subscription and the properties thereof. As such, the client manifest file may identify the first version of the content item and the second version of the content item, and may specify that the first version of the content item utilizes the first level of forward error correction and that the second version of the content item utilizes the second level of forward error correction. Such a client manifest file may further identify other properties of each multicast stream, such as a bitrate of each stream. The client manifest may also identify properties of the streams such as codecs used, video resolutions, markers, captions, and the like. The client manifest may have any suitable form. As a nonlimiting example, the client manifest file may comprise an extensible markup language (XML) file.

Method 200 enables a server to multicast different streams of a single content item that are encoded with various levels of forward error correction. This may help to provide optimal quality within the bandwidth constraints of the "last mile" of delivering content from the provider to the customer, and allow a client to react to detected data loss by switching dynamically to a multicast stream having a different level of forward error correction. As such, multicast subscription based on forward error correction allows a client the ability to trade-off media (e.g. video and audio) quality with error resilience in a multicast environment with limited bandwidth and without the use of feedback channels and data retransmission.

Figure 5:
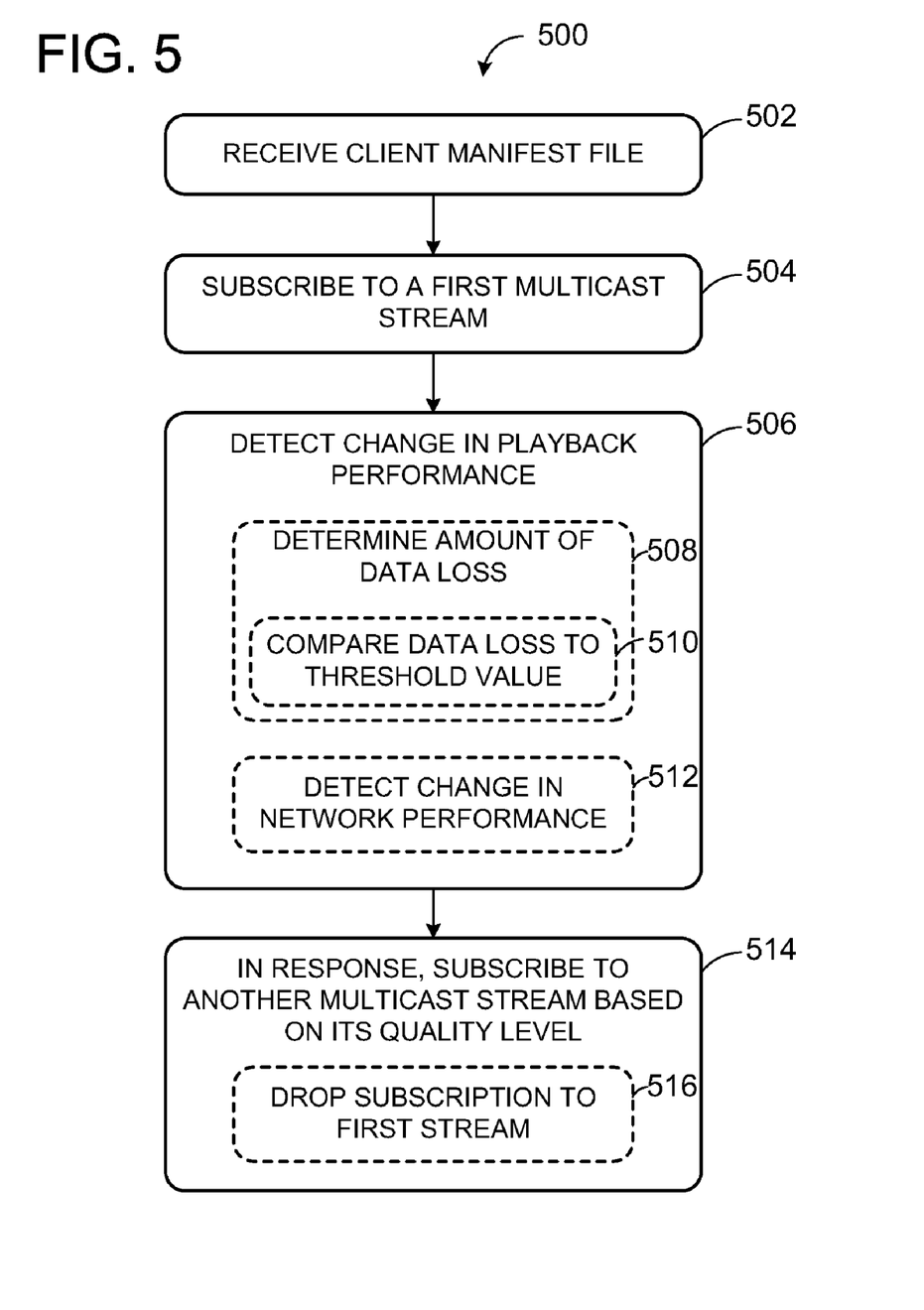
FIG. 5 shows a flow diagram of an example method of receiving multimedia content via a multicast stream sent by a server in accordance with an embodiment of the present disclosure.

Turning now to a client perspective, FIG. 5 illustrates a method 500 of receiving multimedia content on a client computing device via a multicast stream sent by a server. It will be understood that method 500 may be implemented via instructions stored in a data-holding subsystem of a client device that are executable by a logic subsystem of the client device, as depicted for example in client computing device 108 shown FIG. 1 having logic subsystem 122, data-holding subsystem 124 and display subsystem 126. Further, in some cases the data-holding subsystem may be in the form of computer-readable removable media, which may be used to store and/or transfer data and/or instructions executable to implement the herein described methods and processes. When included, display subsystem 126 may be used to present a visual representation of data received from server 100 or otherwise held by data-holding subsystem 124. As the herein described methods and processes change the data held by the data-holding subsystem, and thus transform the state of the data-holding subsystem, the state of display subsystem 126 may likewise be transformed to visually represent changes in the underlying data. Display subsystem 126 may include one or more display devices utilizing virtually any type of technology. Such display devices may be combined with logic subsystem 122 and/or data-holding subsystem 124 in a shared enclosure, or such display devices may be peripheral display devices.

Returning to FIG. 5, at 502, method 500 includes receiving a client manifest file from the server. As mentioned above, the client manifest file identifies the multicast streams available for subscription, wherein each of the plurality of multicast streams has a different quality level based on a level of forward error correction encoded into the multicast stream. Further, in addition to being based on a level of forward error correction, the quality level may be further based on a bitrate of the multicast stream. At 504, method 500 includes subscribing to a first multicast stream of the plurality of multicast streams. In doing so, the client computing device then receives the first multicast stream.

Next, at 506, method 500 includes detecting a change in playback performance at the client computing device. The computing device may detect any suitable type of change in playback performance. For example, method 500 may include detecting the change in playback performance by determining an amount of data loss as indicated at 508, by comparing an amount of data loss to a threshold value, as indicated at 510. As another example, method 500 may detect the change in playback performance by detecting a change in network performance, as indicated at 512.

At 514, method 500 includes, in response to detecting a change in playback performance, subscribing to a second multicast stream of the plurality of multicast streams based on a quality level of the second multicast stream. Thus, the client computing device may react to the data loss by switching dynamically to a multicast stream with a different level of forward error correction.

In some embodiments, method 500 may further include dropping the subscription to the first multicast stream as indicated at 516. As such, if a client detects excessive data loss such that a level of forward error correction in the first multicast stream is insufficient (e.g. is greater than a threshold level of data loss), it may switch to a different quality level, meaning it can drop subscription of the original multicast stream and subscribe to a stream having a greater level of forward error correction. In some embodiments, the client computing device may join the new quality level before dropping the old one in order to minimize service interruption on the transition. Thus, dropping subscription to the first multicast stream may comprise dropping subscription to the first multicast stream after subscribing to the second multicast stream. In other embodiments, the subscription to the first multicast stream may be dropped before the second multicast stream is received.

It will be understood that a client computing device, in some situations, may switch to a multicast stream having a lower level of forward error correction. This may occur, for example, where the client computing device detects a change in playback performance wherein the amount of data loss is below a threshold value. Consequently, the client may seek a stream having less redundant data and a higher video quality by subscribing to a second multicast stream having a lower level of forward error correction than the first multicast stream.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A network-accessible server having a data-holding subsystem holding instructions executable by a logic subsystem to:
  receive a content item;
  form a first version of the content item having a first level of forward error correction;
  form a second version of the content item having a second level of forward error correction;
  stream the first version of the content item to a first multicast address;
  while streaming the first version of the content item, stream the second version of the content item to a second multicast address; and
  transmit a client manifest file that identifies the first version of the content item and the second version of the content item and that specifies that the first version of the content item utilizes the first level of forward error correction and that the second version of the content item utilizes the second level of forward error correction.

2. The network-accessible server of claim 1, wherein the instructions are executable to stream the first version of the content item and to stream the second version of the content item as live television via Internet Protocol television (IPTV) multicasting.

3. The network-accessible server of claim 1, wherein the first version of the content item and the second version of the content item have a same bitrate.

4. The network-accessible server of claim 1, wherein the first version of the content item and the second version of the content item have different bitrates.

5. The network-accessible server of claim 1, wherein the instructions are executable to form a plurality of versions of the content item at each of a plurality of bitrates.

6. The network-accessible server of claim 1, wherein the instructions are executable to form the first version of the content item by transcoding the content item and embedding the first level of forward error correction into the content item, and to form the second version of the content item by transcoding the content item and embedding the second level of forward error correction into the content item.

7. On a network-accessible server, a method of live Internet Protocol television (IPTV) streaming, the method comprising:
receiving a live television multimedia item;
forming a first version of the live television multimedia item having a first bitrate and being encoded with a first level of forward error correction;
forming a second version of the live television multimedia item having a second bitrate and being encoded with a second level of forward error correction;
streaming the first version of the live television multimedia item to a first multicast address;
while streaming the first version of the live television multimedia item, streaming the second version of the live television multimedia item to a second multicast address;
receiving a request for a client manifest file; and
in response, transmitting the client manifest file, the client manifest file identifying the first version of the live television multimedia item and the second version of the live television multimedia item and specifying that the first version of the live television multimedia item utilizes the first level of forward error correction and that the second version of the live television multimedia item utilizes the second level of forward error correction.

8. The method of claim 7, wherein the first bitrate and the second bitrate are equivalent.

9. The method of claim 7, wherein the first bitrate and the second bitrate are different.

10. The method of claim 7, wherein the method further includes forming a plurality of versions of the live television multimedia item at each of a plurality of bitrates.

11. On a client computing device configured to connect to a server via a network, a method of receiving multimedia content via a multicast stream sent by the server, the method comprising:
receiving a client manifest file, the client manifest file identifying a plurality of multicast streams available for subscription, each of the plurality of multicast streams having a different quality level based on a level of forward error correction encoded into the multicast stream;
subscribing to a first multicast stream of the plurality of multicast streams;
detecting a change in playback performance at the client computing device; and
in response, subscribing to a second multicast stream of the plurality of multicast streams based on a quality level of the second multicast stream.

12. The method of claim 11, wherein, for each of the plurality of multicast streams, the quality level of the multicast stream is further based on a bitrate of the multicast stream in addition to being based on a level of forward error correction.

13. The method of claim 11, wherein detecting the change in playback performance includes determining an amount of data loss.

14. The method of claim 13, wherein the amount of data loss is greater than a threshold value and the second multicast stream has a greater level of forward error correction than the first multicast stream.

15. The method of claim 13, wherein the amount of data loss is below a threshold value and the second multicast stream has a lesser level of forward error correction than the first multicast stream.

16. The method of claim 11, further comprising dropping subscription to the first multicast stream.

17. The method of claim 16, wherein dropping subscription to the first multicast stream comprises dropping subscription to the first multicast stream after subscribing to the second multicast stream.

18. The method of claim 11, wherein detecting the change in playback performance includes detecting a change in network performance.

\* \* \* \* \*